United States Patent
Muramatsu et al.

[11] Patent Number: 6,031,274
[45] Date of Patent: Feb. 29, 2000

[54] BACK IRRADIATION TYPE LIGHT-RECEIVING DEVICE AND METHOD OF MAKING THE SAME

[75] Inventors: Masaharu Muramatsu; Hiroshi Akahori, both of Hamamatsu, Japan

[73] Assignee: Hamamatsu Photonics K.K., Hamamatsu, Japan

[21] Appl. No.: 08/948,822

[22] Filed: Oct. 10, 1997

[30] Foreign Application Priority Data

Oct. 11, 1996 [JP] Japan .................................. 8-270006

[51] Int. Cl.⁷ .................................................. H01L 31/00
[52] U.S. Cl. ................................ 257/448; 257/459
[58] Field of Search .......................... 257/249, 448, 257/459, 920

[56] References Cited

U.S. PATENT DOCUMENTS

| | | | |
|---|---|---|---|
| 4,278,989 | 7/1981 | Baba et al. | 257/920 |
| 4,870,475 | 9/1989 | Endo et al. | 257/508 |
| 4,923,825 | 5/1990 | Blouke et al. | 438/64 |

FOREIGN PATENT DOCUMENTS 0 314 334  5/1989  European Pat. Off. .

OTHER PUBLICATIONS

Patent Abstracts of Japan, vol. 095, No. 002, Mar. 31, 1995 & JP –6326293 A (Hamamatsu Photonics KK), Nov. 25, 1994.

*Primary Examiner*—Mahshid Saadat
*Assistant Examiner*—George C. Eckert, II
*Attorney, Agent, or Firm*—Pillsbury Madison & Sutro

[57] ABSTRACT

A back irradiation type light-receiving device, on which light is incident from the back side with respect to a charge-reading section of a semiconductor thin plate, is provided with a reinforcement member on the charge-reading section side. Electric signals are fed in and out from the charge-reading section by way of a polysilicon lead having a short wiring length and a low-resistance aluminum lead which is formed, after the completion of all the steps requiring a high-temperature treatment, so as to be physically and electrically direct-connected to the polysilicon lead. Accordingly, a charge generated in response to the received light can be read out with a high efficiency, while enabling a high-speed operation.

3 Claims, 8 Drawing Sheets

BACK IRRADIATION TYPE LIGHT-RECEIVING DEVICE AND METHOD OF MAKING THE SAME

BACKGROUND OF THE INVENTION

1. Field of the Invention

The present invention relates to a back irradiation type light-receiving device, such as back irradiation type charge coupled device (CCD) or back irradiation type active pixel sensor (APS), which is applicable to radiation of energy rays yielding a large absorption coefficient such as ultraviolet rays, γ-rays, and charged particle rays; and a method of making such a back irradiation type light-receiving device.

2. Related Background Art

In general, practicable CCD imaging devices typically employ any of three systems, i.e., frame transfer (FT), full frame transfer (FFT), and interline transfer (IT). Among others, the FFT system is mainly used for measurement.

The FFT system is advantageous in that, since there is no accumulating section, its light-receiving section can have a larger area, thereby attaining a high light utilization factor, thus making it suitable for measuring weak light. On the other hand, since incident light can be absorbed by a charge transfer electrode therein, the sensitivity of the system remarkably decreases with respect to an input with a large absorption coefficient such as light having a short wavelength.

The light-receiving section of a typical FFT type CCD is configured such that a plurality of polysilicon electrodes cover the surface of the light-receiving section without any clearance, while a PSG film having a thickness of several micrometers is overlaid thereon in order to separate the individual electrodes from each other. In such a configuration, since polysilicon absorbs electrons and light having a wavelength not longer than 400 nm, light with a short wavelength cannot reach the light-receiving section, thus failing to contribute to photoelectric conversion.

Known as such a photodetector is that having a substrate with a thin light-receiving section on the order of 15 to 20 μm, while light is irradiated from the back side of the device-forming surface. The photoelectric conversion section is formed under a gate oxide film and is covered with polysilicon electrodes without any clearance, thus absorbing light having a short wavelength incident thereon from its front side. On the back side of the substrate, since there is no obstacle other than the thin oxide film, a high sensitivity is expected with respect to light having a short wavelength incident thereon from the back side.

This back irradiation type CCD is sensitive to light having a wavelength as short as about 200 nm and can further be applied to an electron bombardment type CCD imaging device. Since this device can utilize the multiplying action of a signal charge generated upon electron bombardment, it is expected to become a highly sensitive imaging device.

The necessity for thinning a back irradiation type light-receiving device such as back irradiation type CCD lies in the following points.

In the back irradiation type light-receiving device, as mentioned above, the back side opposite to the front side of the substrate provided with a charge-reading section or the like serves as an entrance surface for light. On the other hand, light with a wavelength of 200 to 300 nm (ultraviolet light) exhibiting a large absorption coefficient is substantially absorbed at a position slightly inside the entrance surface. Specifically, in the case of a silicon substrate, incident light is substantially absorbed thereby within a depth of 0.01 μm from the entrance surface.

Accordingly, photoelectrons generated in the vicinity of the back side are substantially lost by recombination before they diffuse into a potential well on the front side. Even in the case where the photoelectrons reach the potential well, during the time when they diffuse into a long path of several hundred micrometers, signals may mingle with each other, thus remarkably deteriorating resolution.

Also, in the back irradiation type light-receiving device, in addition to thinning the light-receiving section, it is necessary for the backside entrance surface to be provided with a layer known as accumulation layer, so as to form a potential slope. FIG. 3 is a view for explaining accumulation. In FIG. 3, the right side and left side of the drawing indicate the front side and the back side, respectively. Formed by growth on the back side of a silicon substrate 910 is an oxide film 952 which serves as a protective film.

The oxide film 952, however, always have an oxide film charge and an interface level, each of which functions to deplete the back side of the substrate 910. Namely, in view of a potential profile, as indicated by solid line in FIG. 3, the potential with respect to an electron decreases as the position is nearer to the oxide film 952 on the back side. That is, a photoelectron generated at a position close to the back side fails to reach the potential well of the CCD, and is pushed to the interface between the backside oxide film 952 and silicon so as to be destined for recombination. Accordingly, after the light-receiving section is thinned and its back side is oxidized, the substrate 910 near the backside oxide film 952 is set to an accumulation state so as to attain a potential profile indicated by dotted line in FIG. 3. As a result, even photoelectrons generated at a position close to the back side can efficiently reach the potential well of the CCD on the front side.

The accumulation layer is formed by a method comprising the steps of ion-injecting boron into the backside oxide film 952, and heat-treating it at a temperature not lower than 800° C. so as to activate the injected atoms.

U.S. Pat. No. 4,923,825 discloses a technique (hereinafter referred to as conventional example) concerning a method of making a back irradiation type light-receiving device, which enables a heat treatment such as high-temperature annealing after the formation of a grown oxide film and the ion injection therein, like that mentioned above, and a back irradiation type light-receiving device manufactured by this method.

FIG. 4 is a configurational view showing a back irradiation type light-receiving device using the technique of the conventional example. As shown in FIG. 4, this device comprises: (a) a semiconductor thin plate 910 mainly composed of silicon, in which a charge coupled device (CCD), as a charge-reading section 911, is formed on its front side 916; (b) a field oxide film 920 formed around the charge-reading section 911; (c) polysilicon leads 931 formed on the charge-reading section 911 and at peripheral portions of the charge-reading section 911 on a front side 926 of the field oxide film 920; (d) polysilicon electrodes 932 formed on regions separated by the field oxide film 920 from the region where the charge-reading section 911 is formed; (e) metal leads 933 electrically connecting the polysilicon leads 931 with their corresponding polysilicon electrodes 932; (f) a reinforcement member 940 made of borosilicate glass deposited on the front side 916 of the semiconductor thin plate 910 and on the front side 926 of the field oxide film 920; (g) an accumulation layer 951 formed on a back side 917 of the semiconductor thin plate 910; (h) a protective oxide film 952 formed on the back side of the accumulation layer 951; and (i) metal electrodes 960 formed on the polysilicon electrodes 932.

This back irradiation type light-receiving device is manufactured in the following manner. FIGS. 5A to 5F are views showing, step by step, a method of making the back irradiation type light-receiving device in accordance with the conventional example.

First, on a semiconductor substrate 919, the charge-reading section 911 is formed. Then, the field oxide film 920 is formed. Thereafter, the polysilicon leads 931 and the polysilicon electrodes 932 are formed (see FIG. 5A). Subsequently, the metal leads 933 for electrically connecting the polysilicon leads 931 to their corresponding polysilicon electrodes 932 are formed (see FIG. 5B).

Next, borosilicate glass is deposited on a surface constituted by the front side 916 of the semiconductor substrate 916 and the front side 926 of the field oxide film 920, so as to form the reinforcement member 940 (see FIG. 5C). Subsequently, the semiconductor substrate 919 is thinned so as to form the semiconductor thin plate 910. After the surface of the semiconductor thin plate 910 is provided with the protective oxide film 952, it is activated by ion injection and heating, thus forming the accumulation layer 951 (see FIG. 5D).

Then, of the semiconductor thin plate 910, a portion surrounding the charge-reading section 911 is removed by etching so as to expose the polysilicon electrodes 932 (see FIG. 5E). Subsequently, the metal electrodes 960 are formed on the polysilicon electrodes 932 so as to become bonding pads (see FIG. 5F). Thereafter, the bonding pads are subjected to wire bonding, thus yielding the back irradiation type light-receiving device shown in FIG. 4.

The metal leads 933 held between the semiconductor thin plate 910 and the reinforcement member 940 are heated at a high temperature during the manufacturing the time of sintering borosilicate glass when the reinforcement member 940 is formed, in the heat treatment (800° C. to 900° C.) at the time when the protective oxide film is grown, and in the high-temperature annealing (800° C. to 900° C.) after ion injection.

Accordingly, as a material for the metal leads 933, aluminum whose melting point is about 660° C. cannot be used, and high-melting metals such as molybdenum and tungsten or their silicides are used.

SUMMARY OF THE INVENTION

Since the conventional back irradiation type light-receiving device is manufactured as mentioned above, there have been problems as follows.

The currently-available high-melting metals or their silicides, high-melting metals in particular, are disadvantageous, as compared with aluminum, in terms of adhesiveness to its base, dry-etching characteristic, and property of reducing natural oxide films at the contact portion. Accordingly, it is difficult for them to stably proceed with the process as in the case where aluminum is used.

In suicides of high-melting metals, the adhesiveness to the base and the dry-etching characteristic are better than those in the high-melting metals themselves. Nevertheless, the wiring resistance becomes higher when the silicides of high-melting metals are used.

Astronomical light-receiving devices necessitate a large light-receiving area, whereby their wiring length increases. For example, assuming that the size of one pixel is 12 $\mu$m×12 $\mu$m while 2,048 pixels and 4,096 pixels are respectively arranged in horizontal and vertical directions, the chip size is as large as about 2.5 cm in the horizontal direction and about 5 cm in the vertical direction.

As shown in FIG. 6, when such chips 990 are assembled in a buttable manner as being arranged in 5 pieces in the horizontal direction and 2 pieces in the vertical direction, a very large light-receiving area of 12.5 cm in the horizontal direction and 10 cm in the vertical direction can be obtained. In such a buttable assembly, in order to minimize a dead layer which does not function as a light-receiving section between the chips in the vertical direction, bonding pad portions of individual chips $990_1$ to $990_{10}$ are aligned at one of horizontal sides. Accordingly, the wiring length of the high-melting metal in the vertical direction may be as long as about 5 cm.

A typical sheet resistance of wiring made of a silicide of a high-melting metal is 0.5 $\Omega^{\square}$. Accordingly, assuming that a vertical lead has a width of 20 $\mu$m and a length of 5 cm, its wiring resistance becomes as high as 1,250 $\Omega$. Assuming that the wiring capacity is 40 nF, the CR time constant becomes as large as 50 $\mu$s, thus making it difficult to operate at high speed.

In view of the foregoing, it is an object of the present invention to provide a back irradiation type light-receiving device which can operate at high speed even when it has a large light-receiving area.

It is another object of the present invention to provide a method of making a back irradiation type light-receiving device, which can favorably make the back irradiation type light-receiving device that can operate at high speed even when it has a large light-receiving area.

The back irradiation type light-receiving device in accordance with the present invention is a back irradiation type light-receiving device, in which a charge-reading section having a one-dimensional or two-dimensional arrangement is formed on a first surface of a semiconductor thin plate mainly composed of silicon, for detecting an energy of an electromagnetic wave or charged particle incident on a second surface of the semiconductor thin plate which is a back side of the first surface, the device comprising: (a) a reinforcement member disposed on the first surface side of the semiconductor thin plate; (b) a field oxide film, formed in contact with the reinforcement member around a region where the charge-reading section is formed, exposing a surface thereof opposing an interface with respect to the reinforcement member while excluding at least a peripheral portion of the charge-reading section; (c) a polysilicon lead formed on the charge-reading section and at a region extending from the charge-reading section at the interface between the field oxide film and the reinforcement member to the exposed region of the field oxide film; and (d) a metal lead, which is made of aluminum or an alloy or compound of aluminum, formed on the exposed region of the field oxide film, and physically and electrically direct-connected to the polysilicon lead, having a bonding pad portion for external connection on the first surface side.

Here, as the reinforcement member, one of borosilicate glass and borophosphosilicate glass may preferably be employed.

In this back irradiation type light-receiving device, electric signals are fed in and out from the charge-reading section through the polysilicon lead having a short wiring length and the low-resistance aluminum-based lead (including the bonding pad) that are formed in the vicinity of the charge-reading section. Since the sheet resistance of the aluminum-based lead is on the order of $2 \times 10^{-2}\, \Omega^{\square}$, even when the wiring width and length are respectively assumed to be 20 μm and 5 cm, the wiring resistance is only 50 Ω. Assuming that the wiring capacity is 40 nF, the CR time constant becomes 2 μs, whereby the device operates remarkably faster than the conventional devices.

The method of making the back irradiation type light-receiving device in accordance with the present invention comprises: (a) a first step of forming a charge-reading section on a first surface of a semiconductor substrate mainly composed of silicon; (b) a second step of forming a field oxide film on the first surface of the semiconductor substrate around the charge-reading section; (c) a third step of selectively forming a polysilicon lead on the charge-reading section and on a first surface of the field oxide film corresponding to the first surface of the semiconductor substrate; (d) a fourth step of disposing a reinforcement member on the first surface of the semiconductor substrate and on the first surface of the field oxide film; (e) a fifth step of processing a second surface of the semiconductor substrate to turn the semiconductor substrate into a semiconductor thin plate; (f) a sixth step of injecting an ion into the semiconductor thin plate from the second surface side so as to activate the semiconductor thin plate; (g) a seventh step of eliminating a constituent material of the semiconductor thin plate therefrom while excluding a region where the charge-reading section is formed and a region in the vicinity of the charge-reading section so as to expose the field oxide film; and (h) an eighth step of forming, on the exposed region of the field oxide film, a lead which is physically and electrically direct-connected to the polysilicon lead by means of aluminum or an alloy or compound of aluminum.

Here, the fourth step may be (i) a step of bonding together a surface constituted by the first surfaces of the semiconductor substrate and field oxide film and the reinforcement member; or (ii) a step of depositing a material for the reinforcement member on a surface constituted by the first surfaces of the semiconductor substrate and field oxide film.

Also, as the reinforcement member, one of borosilicate glass and borophosphosilicate glass may preferably be employed.

In this method, before the step of forming the aluminum-based lead (eighth step), all the steps requiring a high-temperature treatment, e.g., the step of disposing the reinforcement member (fourth step), the step of growing the protective oxide film (if desired), the high-temperature annealing step after ion injection (sixth step), and the like, are completed.

Accordingly, while an accumulation layer is being formed on the light-receiving side, aluminum-based wiring, which is an established technique in the conventional semiconductor art, can be used, thus allowing the back irradiation type light-receiving device to be made favorably.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of the back irradiation type light-receiving device and method of making the back irradiation type light-receiving device in accordance with the present invention will be explained with reference to the accompanying drawings. In the explanation of the drawings, elements identical to each other will be referred to with marks identical to each other, without their overlapping descriptions being repeated.

Figure 1:
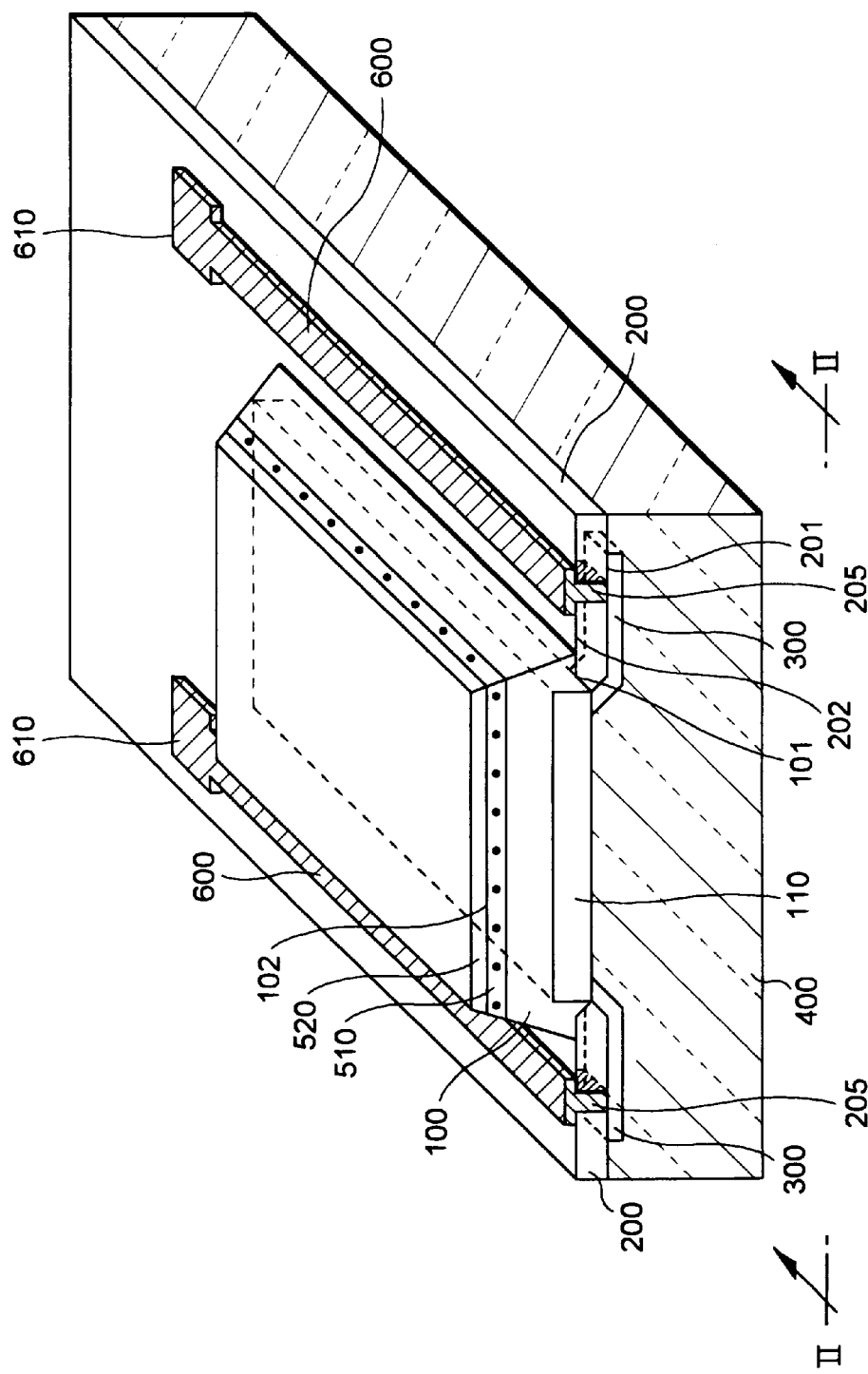
FIG. 1 is a configurational view showing a back irradiation type light-receiving device in accordance with an embodiment of the present invention.

FIG. 1 is a configurational view showing the back irradiation type light-receiving device in accordance with an embodiment of the present invention. As shown in FIG. 1, this light-receiving device comprises: (a) a semiconductor thin plate 100, mainly composed of silicon, having a charge-reading section 110 on its surface 101 side; (b) a field oxide film 200, formed around a region where the charge-reading section 110 is formed, exposing a surface 202 except for the charge-reading section 110 and having contact holes 205 in the exposed region; (c) polysilicon leads 300 formed on the charge-reading section 110 and on a region extending to a region where the contact hole 205 is formed on a surface 201 of the field oxide film 200; (c) a reinforcement member 400 disposed on the surface 201 of the field oxide film 200 on the surface 101 of the semiconductor thin plate 100; (d) an accumulation layer 510 formed on a surface 102 of the semiconductor thin plate 100; (e) a protective oxide film 520 formed on the accumulation layer 510; and (f) aluminum leads 600 (including bonding pad portions 610), formed in the contact holes 205 and on the exposed region of the field oxide film 200, for electrically connecting with the polysilicon leads 300.

Here, as the reinforcement member, borosilicate glass (BSG) or borophosphosilicate glass (BPSG) can preferably be employed.

The back irradiation type light-receiving device in accordance with this embodiment is manufactured as follows. FIGS. 2A to 2F are views showing, step by step, a method of making the back irradiation type light-receiving device in accordance with this embodiment.

First, the charge-reading section 110 is formed on the surface 101 of a semiconductor substrate 190 mainly composed of silicon. Then, the field oxide film 200 is formed on the surface 101 of the semiconductor substrate 190 around the charge-reading section 110. Thereafter, the polysilicon leads 300 are selectively formed on the charge-reading section 110 and on the surface 201 of the field oxide film 200 (see FIG. 2A).

Figure 2A:
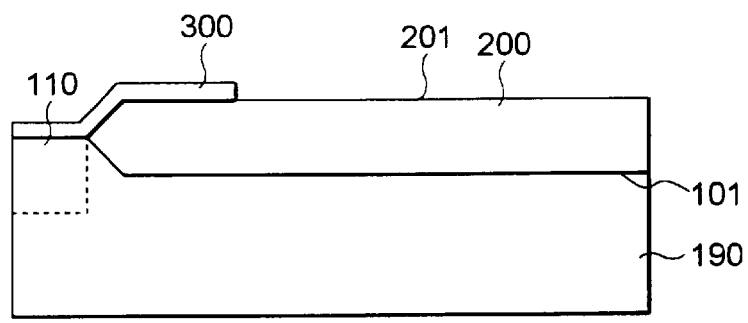
FIGS. 2A to 2F are cross-sectional views taken along a plane containing lines II—II of FIG. 1 showing, step by step, a method of making the back irradiation type light-receiving device in accordance with the above-mentioned embodiment of the present invention.
Figure 2B:
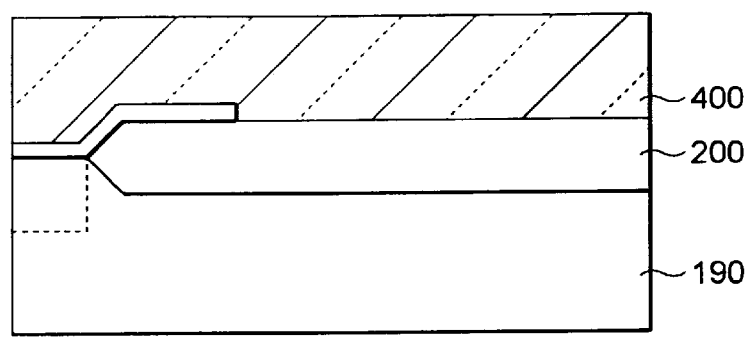
Figure 2C:
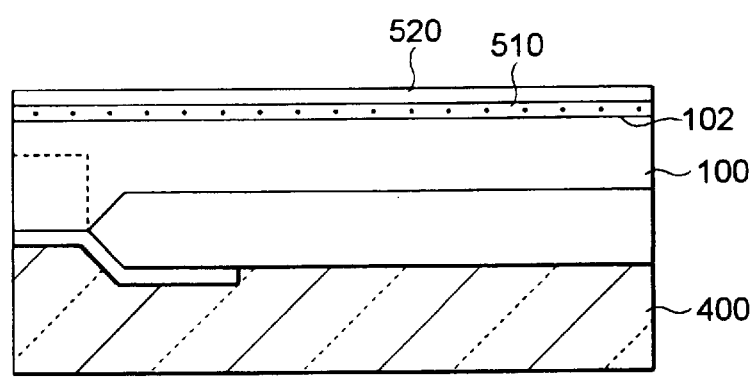
Figure 2D:
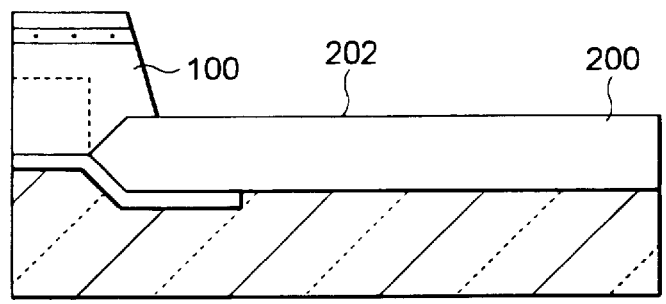

Next, the reinforcement member 400 is disposed on the surface 101 of the semiconductor substrate 190 and on the surface 201 of the field oxide film 200 (see FIG. 2B). As the reinforcement member 400, BSG or BPSG can preferably be employed. Here, a glass body made of BSG or BPSG may be attached to the above-mentioned surfaces by means of an adhesive or, as in the prior art, BSG may be deposited and sintered thereon.

Subsequently, the semiconductor substrate 190 is processed so as to become the semiconductor thin plate 100. After the protective oxide film 520 is formed on the surface 102 of the semiconductor thin plate 100, ions are injected therein from the surface 102 side thereof so as to activate it, thereby forming the accumulation layer 510 (see FIG. 2C).

Figure 2E:
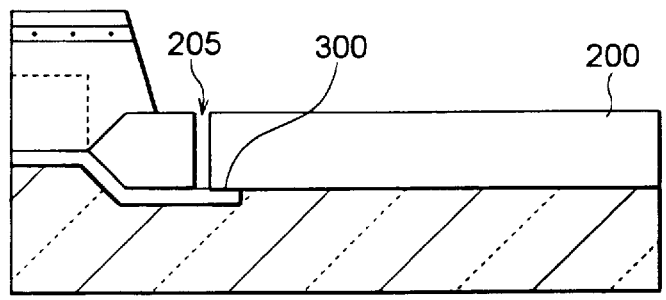
Figure 2F:
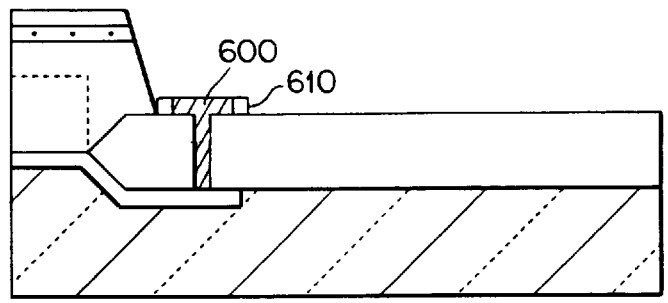
Figure 3:
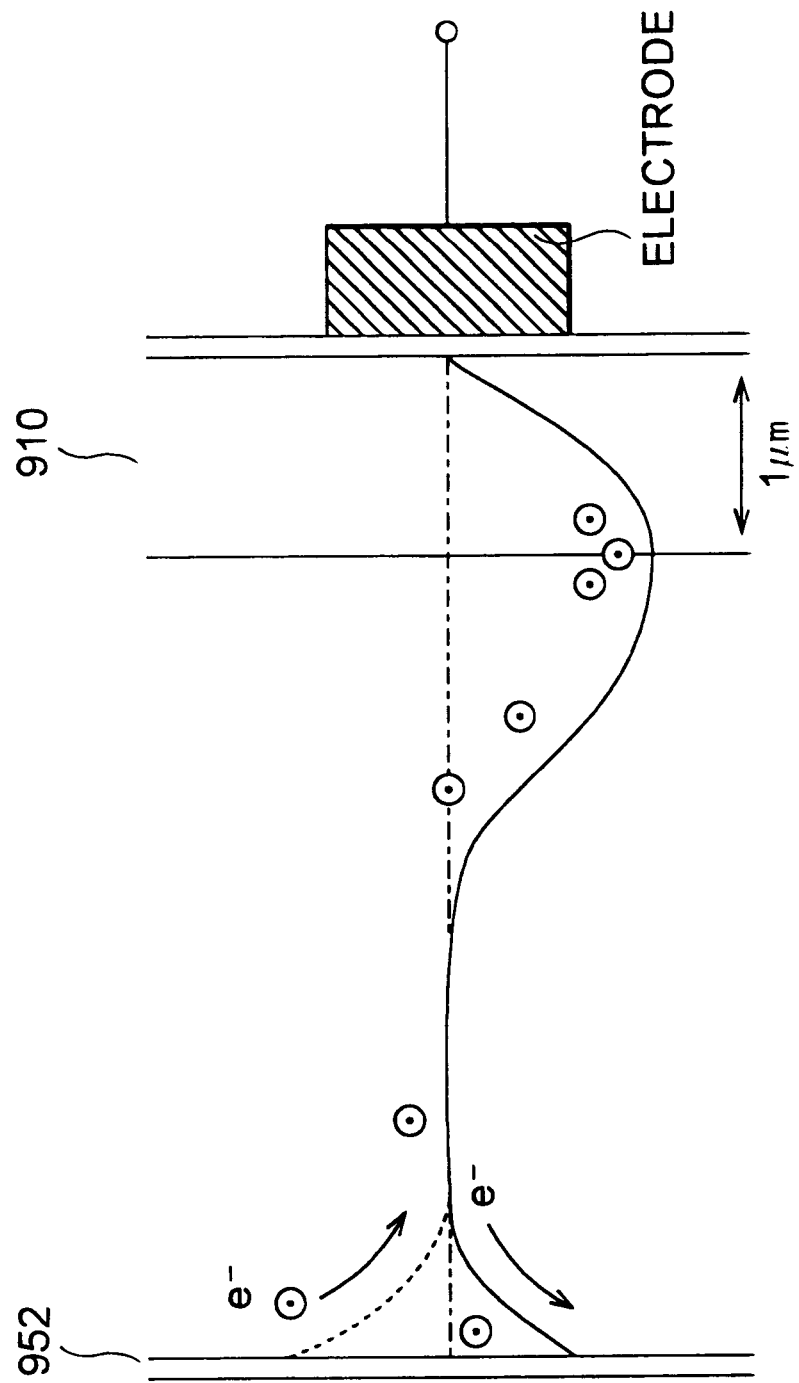
FIG. 3 is a view for explaining accumulation.
Figure 4:
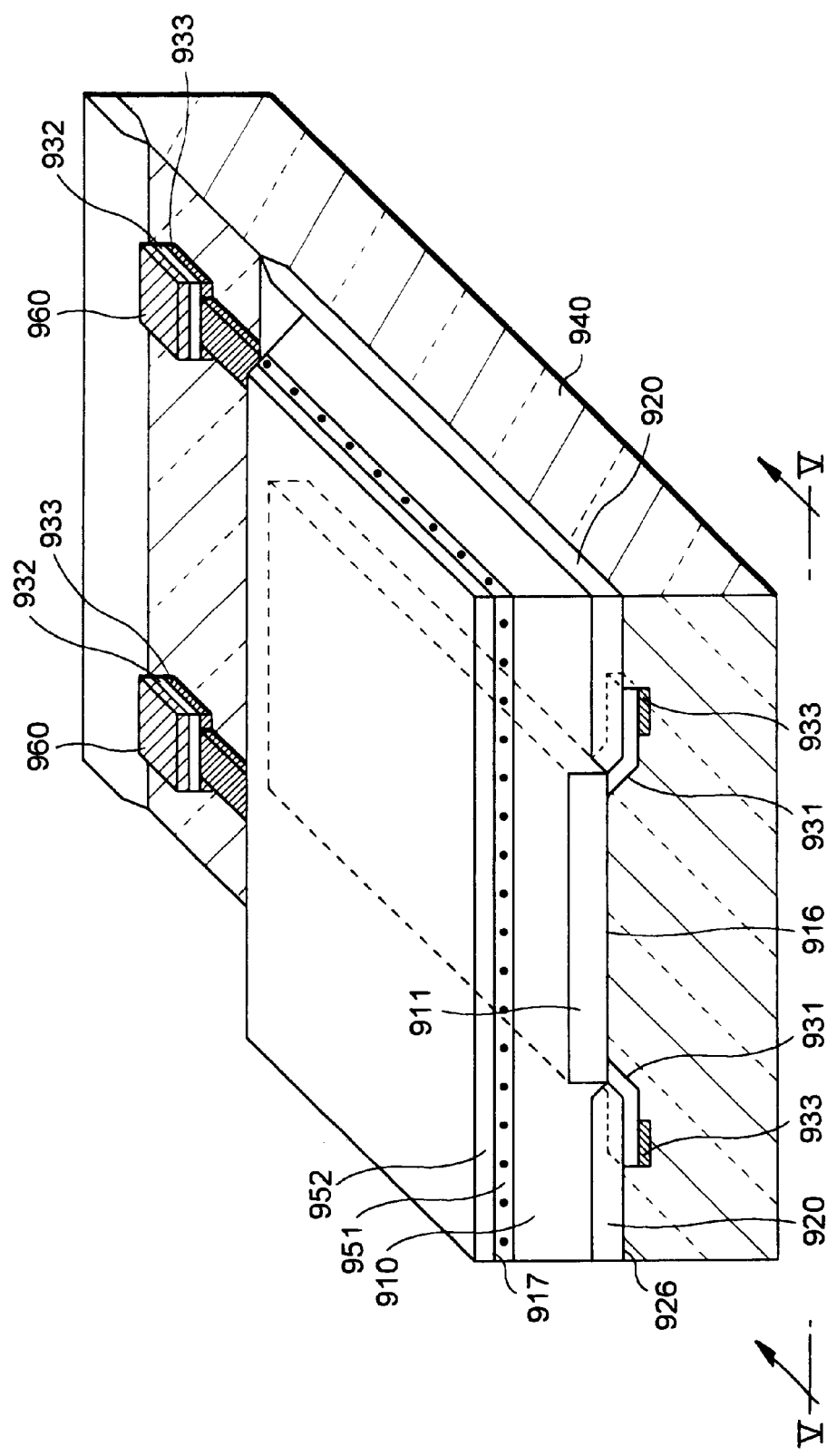
FIG. 4 is a configurational view showing the back irradiation type light-receiving device in accordance with a conventional example.
Figure 5A:
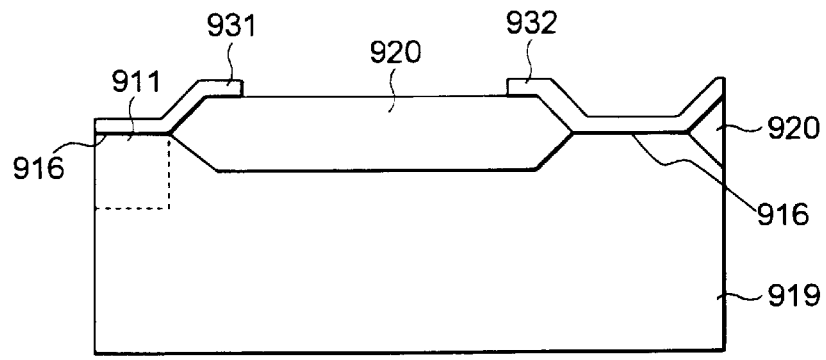
FIGS. 5A to 5F are cross-sectional views taken along a plane containing lines V—V of FIG. 4 showing, step by step, a method of making the back irradiation type light-receiving device in accordance with the conventional example.
Figure 5B:
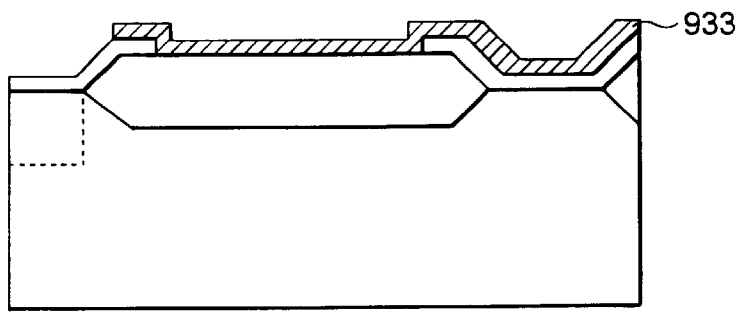
Figure 5C:
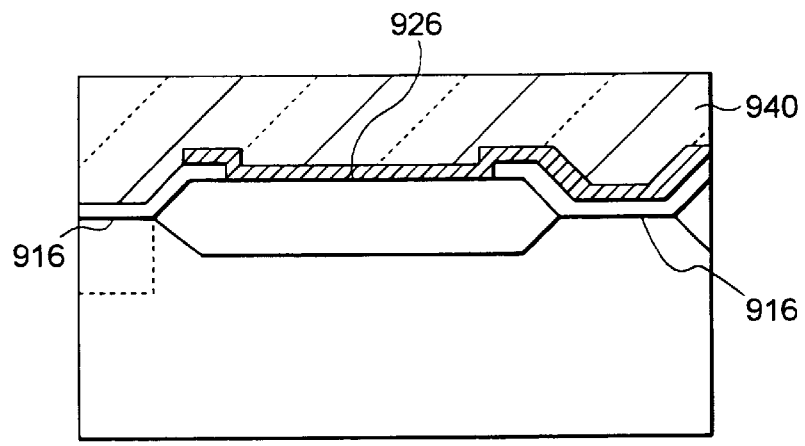
Figure 5D:
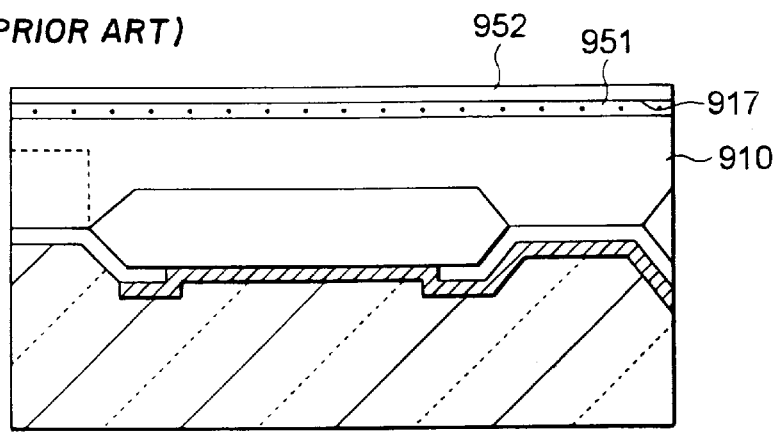
Figure 5E:
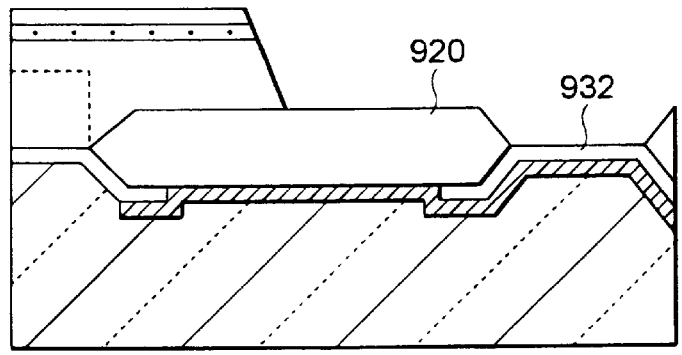
Figure 5F:
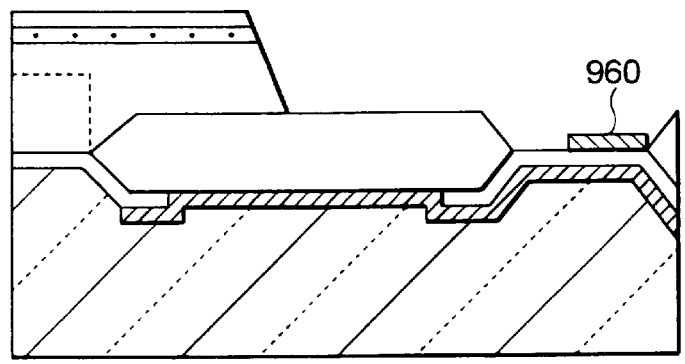
Figure 6:
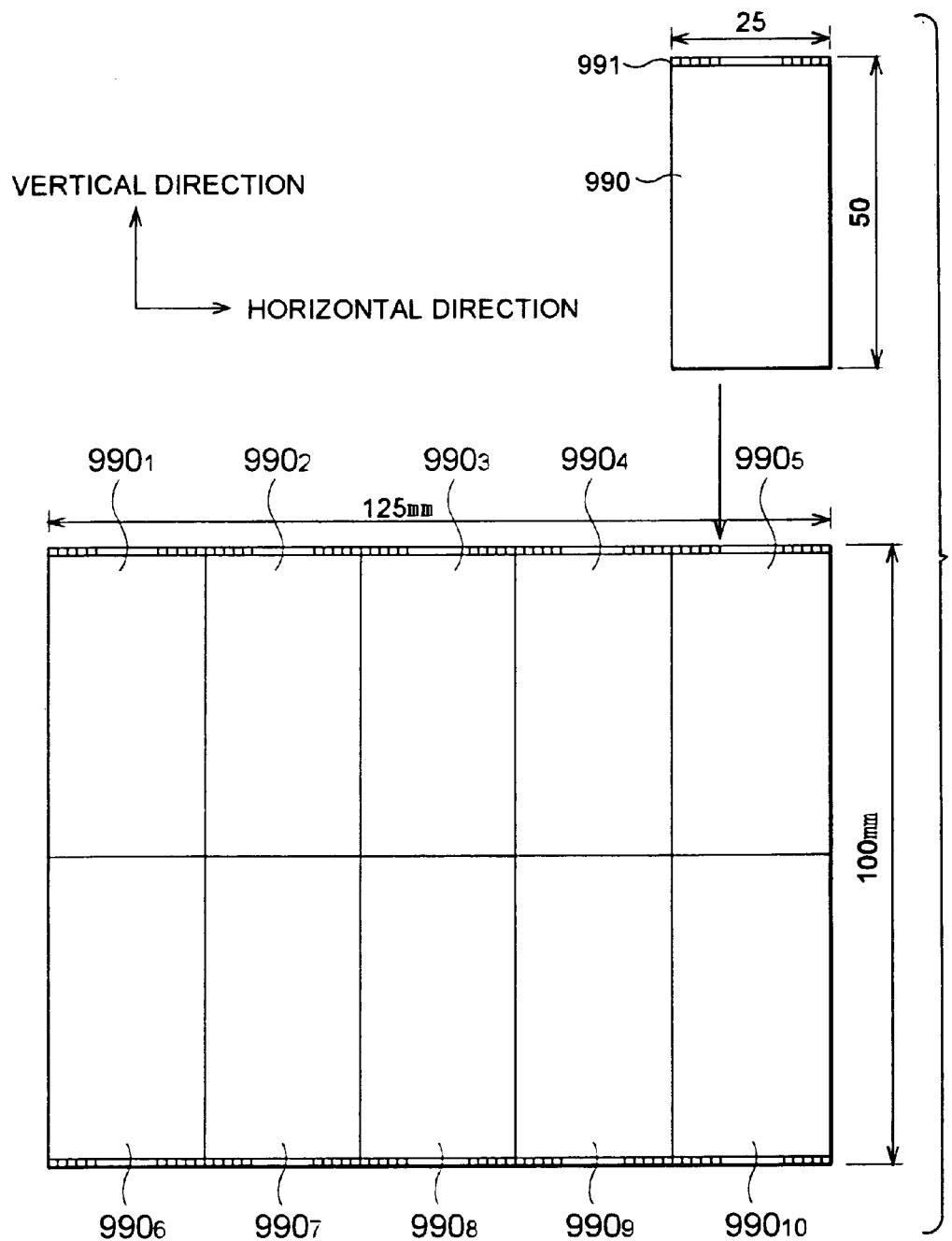
FIG. 6 is a view for explaining buttable assembly.

Then, the constituent material of the semiconductor thin plate 100 is eliminated from the region other than regions constituted by the region where the charge-reading section 110 is formed and the region in the vicinity of the charge-reading section 110, thereby exposing the field oxide film 200 (see FIG. 2D), and the contact holes 205 communicating with their corresponding polysilicon leads 300 are formed at the exposed region of the field oxide film 200 (see FIG. 2E).

Next, in the contact holes 205 of the field oxide film 200 and on the exposed region of the field oxide film 200, the aluminum leads 600 (including the bonding pad portions 610) electrically connecting with their corresponding polysilicon leads 300 are formed. Thereafter, the bonding pad portions 610 are subjected to wire bonding, thus yielding the back irradiation type light-receiving device of this embodiment (see FIG. 2F).

In this method, before the step of forming the aluminum leads 600, all the steps requiring a high-temperature treatment, e.g., the step of disposing the reinforcement member 400, the step of growing the protective oxide film 520, the high-temperature annealing step after ion injection, and the like, are completed.

Accordingly, while the accumulation layer 510 is being formed on the light-receiving side, aluminum-wiring technique, which is an established technique in the conventional semiconductor art, can be used to form the aluminum leads 600.

As a result, in the back irradiation type light-receiving device in accordance with the present invention, since accumulation is enabled on the light-receiving side, the efficiency of collecting charges can be raised, and a high-speed operation is allowed due to its small wiring resistance.

Without being restricted to the foregoing embodiment, the present invention may be modified in various manners which can be attained by one skilled in the art.

For example, in place of the aluminum leads, those made of aluminum-silicon compounds; compounds of aluminum, silicon, and titanium; or various kinds of alloys or compounds based on aluminum may be used.

Also, though the contact holes are formed in the field oxide film so as to physically and electrically direct-connect the aluminum leads to their corresponding polysilicon leads in the above-mentioned embodiment, without being restricted thereto, the polysilicon leads may be exposed on the first surface side so as to be connected to their corresponding aluminum leads.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No.8-270006 (270006/1996) filed on Oct. 11, 1996 is hereby incorporated by reference.

What is claimed is:

1. A back irradiation type light-receiving device, in which a charge-reading section having a one-dimensional or two-dimensional arrangement is formed on a first surface of a semiconductor thin plate mainly composed of silicon, for detecting an energy of an electromagnetic wave or charged particle incident on a second surface of said semiconductor thin plate, said second surface being a back side of said first surface, said device comprising:

a reinforcement member disposed on said first surface side of said semiconductor thin plate;

a field oxide film, formed in contact with said reinforcement member around a region where said charge-reading section is formed, exposing a surface thereof opposing an interface with respect to said reinforcement member while excluding at least a peripheral portion of said charge-reading section;

a polysilicon lead formed on said charge-reading section and at a region extending from said charge-reading section at the interface between said field oxide film and said reinforcement member to the exposed region of said field oxide film; and a metal lead made of aluminum or an alloy or compound of aluminum, formed on the exposed region of said field oxide film, and physically and electrically direct-connected to said polysilicon lead, said metal lead having a bonding pad portion for external connection on said first surface side.

2. A back irradiation type light-receiving device according to claim 1, wherein said reinforcement member comprises one of borosilicate glass and borophosphosilicate glass.

3. A back irradiation type light-receiving device according to claim 1 wherein said metal lead has first and second opposed ends, said first end is physically and electrically direct-connected to said polysilicon lead, and said bonding pad portion is disposed at said second end.

* * * * *